United States Patent
Nakamura et al.

(10) Patent No.: US 7,927,434 B2
(45) Date of Patent: Apr. 19, 2011

(54) CO-CR-PT-B ALLOY SPUTTERING TARGET

(75) Inventors: Yuichiro Nakamura, Ibaraki (JP);
Akira Hisano, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 328 days.

(21) Appl. No.: 10/598,997

(22) PCT Filed: Feb. 15, 2005

(86) PCT No.: PCT/JP2005/002221
§ 371 (c)(1),
(2), (4) Date: Sep. 18, 2006

(87) PCT Pub. No.: WO2005/093124
PCT Pub. Date: Oct. 6, 2005

(65) Prior Publication Data
US 2007/0187236 A1 Aug. 16, 2007

(30) Foreign Application Priority Data
Mar. 26, 2004 (JP) .................... 2004-092645

(51) Int. Cl.
C22C 19/07 (2006.01)
(52) U.S. Cl. .......... 148/425; 204/298.13; 420/436
(58) Field of Classification Search .......... 148/408, 148/425, 674; 204/298.12, 298.13; 420/435, 420/436
See application file for complete search history.

(56) References Cited

U.S. PATENT DOCUMENTS

| | | | |
|---|---|---|---|
| 4,832,810 A | 5/1989 | Nakamura et al. | |
| 4,908,727 A | 3/1990 | Ezaki et al. | |
| 5,352,501 A | 10/1994 | Miyamoto et al. | |
| 5,468,305 A * | 11/1995 | Uchida et al. ......... | 148/120 |
| 6,521,062 B1 | 2/2003 | Bartholomeusz et al. | |
| 6,599,377 B2 | 7/2003 | Bartholomeusz et al. | |
| 2007/0125645 A1* | 6/2007 | Nakamura et al. ....... | 204/298.12 |
| 2007/0209547 A1 | 9/2007 | Irumata et al. | |

FOREIGN PATENT DOCUMENTS

| | | | |
|---|---|---|---|
| JP | 2000-096220 A | | 4/2000 |
| JP | 2001-026860 | * | 1/2001 |
| JP | 2002-069623 | * | 3/2002 |
| JP | 2002-208125 A | | 7/2002 |

OTHER PUBLICATIONS

Full human translation of JP 2002-069623, Ueno et al, published Mar. 2002, 26 pages.*
Full human translation of JP 2001-026860, Ueno et al, published Jan. 2001, 33 pages.*
English translation of JP 2002-208125 to Tomonori Ueno et al., published Jul. 26, 2002, 22 pages.*
Esp@cenet database, one page English Abstract of JP 2002-069625, Mar. 2002.

* cited by examiner

*Primary Examiner* — George Wyszomierski
*Assistant Examiner* — Mark L Shevin
(74) *Attorney, Agent, or Firm* — Howson & Howson LLP

(57) ABSTRACT

Provided is a Co—Cr—Pt—B alloy sputtering target comprising an island-shaped rolled structure formed from a Co-rich phase based on the primary crystal formed upon casting, and a Co—Cr—Pt—B alloy sputtering target in which the island-shaped rolled structure has an average size of 200 μm or less. This Co—Cr—Pt—B alloy sputtering target has an uniform and fine rolled structure with minimal segregation and residual stress upon casting, and the present invention aims to enable the stable and inexpensive manufacture of the target, prevent or suppress the generation of particles, and to improve the production yield of deposition.

13 Claims, 1 Drawing Sheet

Total rolling ratio: 0 %

Total rolling ratio: Approximately 30 %

Total rolling ratio: Approximately 70 %

_US 7,927,434 B2_

CO-CR-PT-B ALLOY SPUTTERING TARGET

BACKGROUND OF THE INVENTION

The present invention relates to a Co—Cr—Pt—B alloy sputtering target having a uniform and fine rolled structure with minimal segregation and residual stress upon casting.

In recent years, a Co—Cr—Pt—B alloy is being used as a sputtering target for forming the magnetic film of a hard disk.

To form a film by sputtering method, a substrate which is formed of a positive electrode and a target which is formed of a negative electrode are faced each other, a high voltage is applied between such substrate and target under an inert gas atmosphere, and an electric field are generated.

The sputtering method employs the principle in which plasma is formed under the above-mentioned high impressed voltage, the positive ions within this plasma collide with the target (negative electrode) surface, whereby the atoms structuring the target is expelled, and the film is formed by the expelled atoms adhering to the opposing substrate surface.

As the sputtering method, employed may be a high frequency sputtering (RF) method, magnetron sputtering method, DC (direct current) sputtering method and so on, these methods are suitably adopted in accordance with the target material or deposition conditions.

Generally, upon manufacturing a sputtering target, such target is demanded of having a uniform and fine structure, and without any defects such as pores therein. When the target structure is uneven and numerous defects exist, these defects are reflected in the deposited film, and an uneven film inferior in performance will be formed. Further, this will also raise the problem of the increased generation of particles upon forming a sputtered film.

Moreover, there is another problem in that the coercive force value and variations thereof of the thin film medium formed via sputtering will change due to the used target.

Thus, attempts have been made for obtaining a uniform and fine processed structure by performing rolling processing after melting and casting the target material (c.f. Patent Document 1 for example).

Nevertheless, with a Co—Cr—Pt—B alloy casting, there is a problem in that segregation and residual stress resulting from the unevenness of the cooling speed during solidification would occur. Segregation and residual stress causes unevenness and defects in the sputtered deposition, and it is necessary to eliminate these as much as possible.

Although it is possible to suppress such segregation and residual stress by strictly controlling the casting conditions, the once generated segregation and residual stress must be removed thereafter.

[Patent Document 1]
Gazette of Japanese Patent Laid-Open Publication No. 2002-69625

SUMMARY OF THE INVENTION

Thus, the present invention relates to a Co—Cr—Pt—B alloy sputtering target having a uniform and fine rolled structure with minimal segregation and residual stress upon casting, and an object thereof is to enable the stable and inexpensive manufacture of the target, prevent or suppress the generation of particles, and to improve the production yield of deposition.

As a result of intense study to overcome the foregoing problems, the present inventors discovered that a high-quality film can be formed and the product yield can be significantly improved by rolling a Co—Cr—Pt—B alloy and obtaining a fine and uniform rolled structure.

Based on the foregoing discovery, the present invention provides: (1) a Co—Cr—Pt—B alloy sputtering target comprising an island-shaped rolled structure formed from a Co-rich phase based on the primary crystal formed upon casting; and (2) a Co—Cr—Pt—B alloy sputtering target according to (1) above, wherein the island-shaped rolled structure has an average size of 200 μm or less.

The present invention further provides: (3) a Co—Cr—Pt—B alloy sputtering target according to (1) or (2) above, comprising a Co-rich phase and B-rich phase island structure based on the eutectic structure formed upon solidification between the island-shaped structures formed from a Co-rich phase based on the primary crystal; (4) a Co—Cr—Pt—B alloy sputtering target according to any one of (1) to (3) above, wherein the average crystal grain size of the crystal in the Co-rich phase is 50 μm or less; (5) a Co—Cr—Pt—B alloy sputtering target according to any one of (1) to (4) above, comprising a hot rolled structure; and (6) a Co—Cr—Pt—B alloy sputtering target according to (5) above, wherein the hot rolling ratio is 15 to 40%.

The present invention yields a superior effect of reducing the segregation and internal stress inside the sputtering target to obtain a fine and uniform rolled structure by performing an appropriate amount of rolling to the cast ingot of the Co—Cr—Pt—B alloy, and as a result enabling the formation of a high-quality film, and the significant improvement in the production yield thereof.

An additional effect is yielded in that since, due to the rolling, the target structure becomes uniform and fine and the internal defects are reduced, the generation of particles upon forming a sputtered film can be significantly reduced.

DETAILED DESCRIPTION OF THE INVENTION

Figure 1:
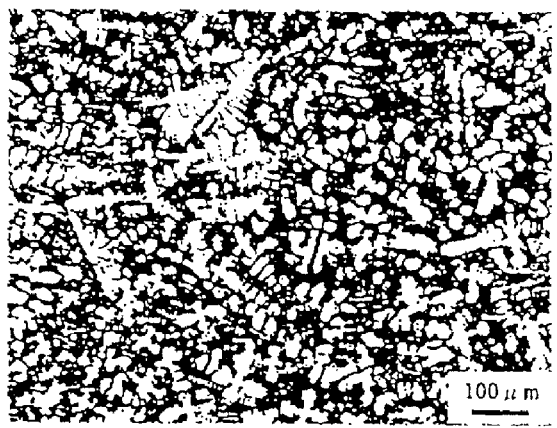
FIG. 1 is a micrograph of the target of Comparative Example 1 prepared from a cast ingot that was not subject to rolling.

As the primary material of the Co—Cr—Pt—B alloy sputtering target of the present invention, Co—Cr—Pt—B alloy containing Cr: 1 to 40 at %, Pt: 1 to 30 at %, B: 10 to 25 at %, and Co for the remaining portion thereof; Co—Cr—Pt—B—Cu alloy containing Cr: 1 to 40 at %, Pt: 1 to 30 at %, B: 9 to 25 at %, Cu: 1 to 10 at %, B+Cu: 10 to 26 at %, and Co for the remaining portion thereof; Co—Cr—Pt—B—Ta alloy containing Cr: 1 to 40 at %, Pt: 1 to 30 at %, B: 1 to 25 at %, Ta: 1 to 10 at %, B+Ta: 3 to 26 at %, and Co for the remaining portion thereof, and so on may be employed.

These materials are useful as the sputtering target for forming the magnetic disk of a hard disk.

The Co—Cr—Pt—B alloy sputtering target of the present invention comprises a dendrite structure formed from a Co-rich phase based on the primary crystal formed upon casting. It is desirable that the cast structure comprises a uniform and even cast structure in which the diameter of the dendrite branch is 100 μm or less. Further, upon casting, it is desirable to prevent the molten metal in the mold from moving around, and to reduce the engulfment of inclusions or air bubbles.

The dendrite structure will be destroyed upon casting as a result of being rolled, and the rolled structure will become an island-shaped structure extending slightly in the rolled direction, and the average crystal grain size will become 200 μm or less. A B-rich phase exists adjacent to the Co-rich phase of this island structure. In other words, this comprises a Co-rich phase and B-rich phase island structure based on the eutectic structure formed upon solidification between the island-shaped structures formed from a Co-rich phase based on the primary crystal, but this island structure will also be formed, upon being rolled, in a phase that extends slightly in the rolled direction.

Since the Co—Cr—Pt—B alloy is a hard and brittle material, prescribed rolling is performed by repeating hot rolling and heat treatment. It is desirable that the hot rolling ratio is 15 to 40%.

If the hot rolling ratio is less than 15%, the dendrite structure, which is the cast structure, will not be destroyed, and it will not be possible to sufficiently remove segregation and residual stress.

Further, when the hot rolling ratio exceeds 40%, the Co-rich phase of the primary crystal and the Co-rich phase that was finely dispersed in the eutectic portion will bond and become coarse due to the repeated hot rolling and heat treatment, and will become a deformed structure caused by the rolling. Further, in parallel therewith, the B-rich phase that was finely dispersed in the eutectic area upon solidification will also bond adjacently and become coarse.

Ordinarily, since the difference in the sputtering rate of the Co-rich phase and B-rich phase will have an adverse effect on an even deposition, such coarsening must be avoided. It is necessary to keep the Co-rich phase and B-rich phase a fine structure by hot rolling; that is, the size of the Co-rich phase and B-rich phase is the finest at the time of casting, but, as described above, it is necessary to remove the segregation and residual stress caused by the cooling speed upon solidification, and it is necessary to perform the hot rolling within a range where the coarsening of the respective phases will not progress significantly. In light of the above, it is necessary to keep the hot rolling ratio at 40% or less.

It is desirable that the average crystal grain size of the crystals in the Co-rich phase is 50 μm or less. A fine structure is effective in suppressing the generation of particles, improving the production yield of deposition, and formation of a uniform sputtered film.

Further, cooling processing via rolling at 10% or less or casting may also be performed. As a result, the magnetic properties of the target material can be further suppressed.

The target of the present invention is able to provide a sputtering target in which the maximum magnetic permeability ($\mu$ max) is 20 or less.

EXAMPLES

The present invention is now explained in detail with reference to the Examples and Comparative Examples. Incidentally, these Examples are merely illustrative, and the present invention shall in no way be limited thereby. In other words, the present invention shall only be limited by the scope of claim for a patent, and shall include the various modifications other than the Examples of this invention.

Examples 1 to 5 and Comparative Examples 1 and 2

A Co—Cr—Pt—B alloy raw material containing Cr: 15 at %, Pt: 13 at %, B: 10 at %, and Co for the remaining portion thereof was melted via high frequency (vacuum) melting. This was cast with a mold assembled with cobalt on a copper stool at a temperature of melting point+100° C. to obtain an ingot of 200×300×30 t.

This was subject to the heat treatment and hot rolling under the conditions shown in Table 1. Comparative Example 1 was only subject to annealing, and hot rolling was not performed thereto. The coercive force of the medium, in-plane variation of the coercive force, and the average size of the island-shaped rolled structure formed from a Co-rich phase employed in the respective targets are similarly shown in Table 1. Further, representative examples of the micrographs of the rolled structure are show in FIGS. 1 to 3.

TABLE 1

Figure 2:
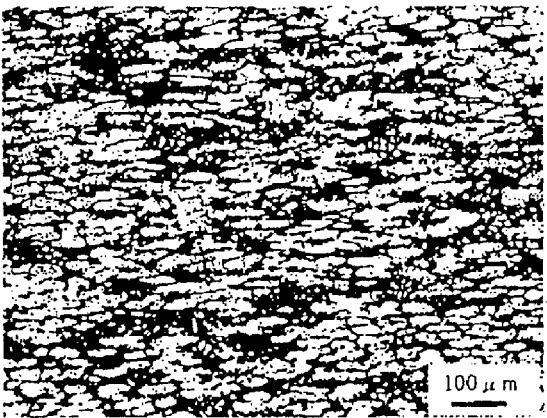
FIG. 2 is a micrograph of the target of Example 4 subject to hot rolling at a rolling ratio of approximately 30%.
Figure 3:
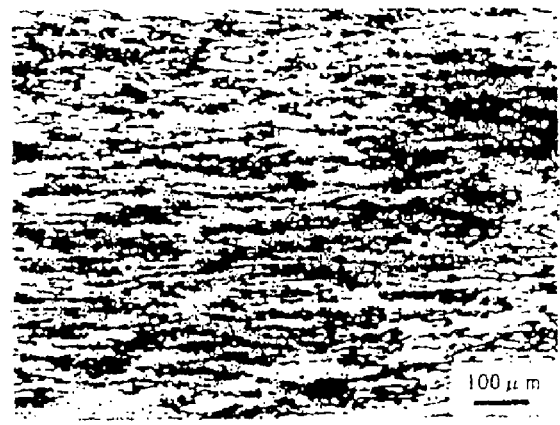
FIG. 3 is a micrograph of the target of Comparative Example 2 subject to hot rolling at a rolling ratio of approximately 70%.

| | Rolling Ratio (%) | Heat Treatment or Annealing (° C.) | Coercive Force (Hc)Oe | In-plane Variation of Coercive Force | Island Structure (μm) | Structure Photograph |
|---|---|---|---|---|---|---|
| Comparative Example 1 | 0 | 1100 | 3300 | 150 | Cast Dendrite Structure | FIG. 1 |
| Example 1 | 17 | 1100 | 3293 | 63 | 50 to 100 | — |
| Example 2 | 20 | 1100 | 3287 | 65 | 50 to 100 | — |
| Example 3 | 25 | 1100 | 3290 | 68 | 50 to 100 | — |
| Example 4 | 30 | 1100 | 3285 | 62 | 50 to 100 | FIG. 2 |
| Example 5 | 35 | 1100 | 3282 | 58 | 50 to 100 | — |
| Comparative Example 2 | 70 | 1100 | 3130 | 55 | 300 to 500 | FIG. 3 |

Size of island structure: Size of island-shaped rolled structure formed from a Co-rich phase.
In-plane variation of coercive force: Max − Min (difference between maximum and minimum) (Hc)Oe As shown in Table 1, Comparative Example 1 is a dendrite structure as cast, and possesses a relatively fine cast structure (c.f. FIG. 1). Nevertheless, the in-plane variation of the coercive force of the medium is large at ±150 Oe, and this is considered to be caused by the segregation and residual stress having an adverse effect on the uniform deposition upon sputtering.

Contrarily, Examples 1 to 5 possess a fine rolled structure in which the size of the island-shaped rolled structure formed from a Co-rich phase is 200 μm or less (c.f. FIG. 2), and, as a result of having reduced the segregation and residual stress, the in-plane variation of the coercive force Hc of the medium became 100 Oe or less, and a favorable target was obtained.

Meanwhile, as shown in Comparative Example 2 of Table 1, when the rolling is performed outside the scope of the present invention, the size of the island-shaped rolled structure formed from a Co-rich phase coarsened and became 300 to 500 μm. This is because the Co-rich phase of the primary crystal and the Co-rich phase that was finely dispersed in the eutectic portion bonded and became coarse due to the repeated hot rolling and heat treatment, and became a deformed structure caused by the rolling. Further, in parallel therewith, the B-rich phase that was finely dispersed in the eutectic area upon solidification also bonded adjacently and became coarse. The coarsening becomes significant when the hot rolling ratio exceeds 40%. Therefore, the Hc value of the medium is considered to be decreasing.

The difference in the sputtering rate of the Co-rich phase and B-rich phase will have an adverse effect on the even deposition, and such coarsening is not preferable. Therefore, it is necessary keep the hot rolling ratio at 40% or less.

If hot rolling is performed even slightly, an effect is yielded in that the segregation and residual stress will decrease to a certain degree. Nevertheless, since the significant effect of the segregation and residual stress decreasing, and the in-plane variation of the coercive force Hc becoming 100 Oe or less will only happen when the hot rolling ratio is 15%, it is desirable to maintain the hot rolling ratio at 15% to 40%.

The value and variations of the coercive force of the medium formed via sputtering will change upon being significantly affected by the target used. Accordingly, this is a typical example where it is extremely important that a Co—Cr—Pt—B alloy sputtering target is a target having a uniform and fine rolled structure with minimal segregation and residual stress.

The present invention yields a superior effect of reducing the segregation and internal stress inside the sputtering target to obtain a fine and uniform rolled structure by performing an appropriate amount of rolling to the cast ingot of the Co—Cr—Pt—B alloy, and as a result enabling the formation of a high-quality film, and the significant improvement in the production yield thereof.

There is an effect that since, due to the rolling, the target structure becomes uniform and fine and the internal defects are reduced, the generation of particles upon forming a sputtered film can be significantly reduced. A Co—Cr—Pt—B alloy thin film having superior characteristics as a target for forming a thin film for electronic components can be obtained thereby, and this is in particular preferable as the magnetic film of a hard disk.

The invention claimed is:

1. A Co—Cr—Pt—B alloy sputtering target consisting of 1 to 40 at % Cr, 1 to 30 at % Pt, 10 to 25 at % B and a remainder of Co, island-shaped rolled structures formed from a Co-rich phase based on a primary crystal formed upon casting, Co-rich phase island structures based on an eutectic structure formed upon solidification, and B-rich phase island structures based on an eutectic structure formed upon solidification, said Co-rich phase and B-rich phase island structures based on the eutectic structure formed upon solidification being located between the island-shaped structures formed from the Co-rich phase based on the primary crystal, and said target being a hot rolled structure formed as a result of hot rolling at a hot rolling ratio of 15 to 40%.

2. A Co—Cr—Pt—B alloy sputtering target according to claim 1, wherein the island-shaped rolled structure has an average size of 200 μm or less.

3. A Co—Cr—Pt—B alloy sputtering target according to claim 2, wherein an average crystal grain size of the crystal in the Co-rich phase is 50 μm or less.

4. A Co—Cr—Pt—B alloy sputtering target according to claim 1, wherein an average crystal grain size of the crystal in the Co-rich phase is 50 μm or less.

5. A Co—Cr—Pt—B alloy sputtering target according to claim 1, wherein said island-shaped rolled structures formed from said Co-rich phase have an average size of 50 to 100 μm.

6. A Co—Cr—Pt—B alloy sputtering target according to claim 1, wherein said Co—Cr—Pt—B alloy sputtering target has a coercive force (He) of 3282 to 3293 Oe.

7. A sputtering target for forming a magnetic film of a hard disk, consisting of:
a sputtering target body having a hot rolled structure and a maximum magnetic permeability of 20 or less and consisting of a Co—Cr—Pt—B alloy in which an as-cast dendrite structure of said alloy no longer exists as a result of said cast alloy being hot-rolled at a hot rolling ratio of 15 to 40%, said alloy consisting of 1 to 40 at % Cr, 1 to 30 at % Pt, 10 to 25 at % B and a remainder of Co;
said alloy of said sputtering target body consisting of island-shaped rolled structures each formed from a Co-rich phase based on a primary crystal formed upon casting, Co-rich phase island structures based on an eutectic structure formed upon solidification, and B-rich phase island structures based on an eutectic structure formed upon solidification;
said island-shaped rolled structures formed from said Co-rich phase based on the primary crystal formed upon casting extending in a direction of rolling and having an average size of 200 μm or less, and the crystals in said Co-rich phase based on the primary crystal formed upon casting having an average crystal grain size of 50 μm or less; and
said Co-rich phase and B-rich phase island structures based on the eutectic structure formed upon solidification being located between said island-shaped rolled structures formed from said Co-rich phase based on said primary crystal.

8. A Co—Cr—Pt—B alloy sputtering target according to claim 7, wherein said island-shaped rolled structures formed from said Co-rich phase have an average size of 50 to 100 μm.

9. A Co—Cr—Pt—B alloy sputtering target according to claim 8, wherein said alloy of said sputtering target body has an in-plane variation of coercive force (Hc) of ±100 Oe or less.

10. A Co—Cr—Pt—B alloy sputtering target according to claim 9, wherein said in-plane variation of coercive force (Hc) is ±58 to ±68 Oe.

11. A Co—Cr—Pt—B alloy sputtering target according to claim 10, wherein said alloy of said sputtering target body has a coercive force (Hc) of 3282 to 3293 Oe.

12. A Co—Cr—Pt—B alloy sputtering target according to claim 11, wherein said alloy consists of 15 at % Cr, 13 at % Pt, 10 at % B and a remainder of Co.

13. A sputtering target for forming a magnetic film of a hard disk, consisting of:
a sputtering target body having a maximum magnetic permeability of 20 or less and consisting of a Co—Cr—

Pt—B alloy in which an as-cast dendrite structure of said alloy no longer exists as a result of said cast alloy being hot-rolled at a hot rolling ratio of 15 to 40%, said alloy consisting of 1 to 40 at % Cr, 1 to 30 at % Pt, 10 to 25 at % B and a remainder of Co;

said alloy of said sputtering target body consisting of island-shaped rolled structures each formed from a Co-rich phase based on a primary crystal formed upon casting, Co-rich phase island structures based on an eutectic structure formed upon solidification, and B-rich phase island structures based on an eutectic structure formed upon solidification;

said island-shaped rolled structures formed from said Co-rich phase based on the primary crystal formed upon casting extending in a direction of rolling and having an average size of 200 µm or less, and the crystals in said Co-rich phase based on the primary crystal formed upon casting having an average crystal grain size of 50 µm or less;

said Co-rich phase and B-rich phase island structures based on the eutectic structure formed upon solidification being located between said island-shaped rolled structures formed from said Co-rich phase based on said primary crystal; and said alloy of said sputtering target body having a coercive force (Hc) of 3282 to 3293 Oe.

\* \* \* \* \*